United States Patent
Shichiri (10) Patent No.: US 9,785,168 B2
(45) Date of Patent: Oct. 10, 2017

(54) POWER GENERATION AMOUNT PREDICTION APPARATUS, METHOD FOR CORRECTING POWER GENERATION AMOUNT PREDICTION, AND NATURAL ENERGY POWER GENERATION SYSTEM

(71) Applicant: KYOCERA CORPORATION, Kyoto (JP)

(72) Inventor: Kazumasa Shichiri, Yokohama (JP)

(73) Assignee: KYOCERA CORPORATION, Kyoto (JP)

( * ) Notice: Subject to any disclaimer, the term of this patent is extended or adjusted under 35 U.S.C. 154(b) by 583 days.

(21) Appl. No.: 14/373,875

(22) PCT Filed: Jan. 17, 2013

(86) PCT No.: PCT/JP2013/000203
§ 371 (c)(1),
(2) Date: Jul. 22, 2014

(87) PCT Pub. No.: WO2013/111541
PCT Pub. Date: Aug. 1, 2013

(65) Prior Publication Data
US 2014/0358316 A1    Dec. 4, 2014

(30) Foreign Application Priority Data

Jan. 23, 2012 (JP) ................ 2012-010722

(51) Int. Cl.
*G05D 3/12* (2006.01)
*G05D 5/00* (2006.01)
(Continued)

(52) U.S. Cl.
CPC .......... *G05F 1/66* (2013.01); *H01L 31/02021* (2013.01); *H02J 3/383* (2013.01);
(Continued)

(58) Field of Classification Search
None
See application file for complete search history.

(56) References Cited

U.S. PATENT DOCUMENTS

| 2003/0047209 A1* | 3/2003 | Yanai | H02J 3/32 136/244 |
|---|---|---|---|
| 2011/0238232 A1* | 9/2011 | Tomita | H02J 3/32 700/291 |
| 2012/0181864 A1 | 7/2012 | Honma | |

FOREIGN PATENT DOCUMENTS

| JP | 2003-309928 A | 10/2003 |
|---|---|---|
| JP | 2005-012912 A | 1/2005 |

(Continued)

OTHER PUBLICATIONS

International Search Report; PCT/JP2013/000203; Apr. 9, 2013.
(Continued)

*Primary Examiner* — Diem Cao
(74) *Attorney, Agent, or Firm* — Procopio Cory Hargreaves and Savitch LLP (57) ABSTRACT

A power generation amount prediction apparatus includes a first detector, acquisition unit, database, and controller. The first detector detects a measured value of the power generation amount of a photovoltaic power generation device. The acquisition unit acquires a predicted value of the power generation amount by the photovoltaic power generation device at specific times. The database stores the measured value and the predicted value for each of the specific times for a plurality of days. The controller calculates a corrected predicted value for each of the specific times based on a maximum measured value, a maximum predicted value, and a predicted value newly received by the acquisition unit. The maximum measured value and the maximum predicted value are respectively the maximum value, for each of the specific times, of the measured value and of the predicted value for a predetermined number of days.

9 Claims, 5 Drawing Sheets

(51) Int. Cl.
| | |
|---|---|
| *G05D 9/00* | (2006.01) |
| *G05D 11/00* | (2006.01) |
| *G05D 17/00* | (2006.01) |
| *G05F 1/66* | (2006.01) |
| *H02J 3/38* | (2006.01) |
| *H01L 31/02* | (2006.01) |
| *H02S 10/20* | (2014.01) |
| *H02J 3/00* | (2006.01) |

(52) U.S. Cl.
CPC ......... *H02S 10/20* (2014.12); *H02J 2003/003* (2013.01); *H02J 2003/007* (2013.01); *Y02E 10/563* (2013.01)

(56) References Cited

FOREIGN PATENT DOCUMENTS

| | | |
|---|---|---|
| JP | 2005-086953 A | 3/2005 |
| JP | 2007-173657 A | 7/2007 |
| JP | 2009-240080 A | 10/2009 |
| WO | 2011/036523 A1 | 3/2011 |

OTHER PUBLICATIONS

Written Opinion of the International Searching Authority with concise explanation; PCT/JP2013/000203; Apr. 9, 2013.
Extended European Search Report dated Sep. 18, 2015 issued in corresponding application.

\* cited by examiner

POWER GENERATION AMOUNT PREDICTION APPARATUS, METHOD FOR CORRECTING POWER GENERATION AMOUNT PREDICTION, AND NATURAL ENERGY POWER GENERATION SYSTEM

CROSS-REFERENCE TO RELATED APPLICATION

This application claims priority to and the benefit of Japanese Patent Application No. 2012-10722 filed Jan. 23, 2012, the entire contents of which are incorporated herein by reference.

TECHNICAL FIELD

The present invention relates to a power generation amount prediction apparatus that calculates a predicted value of the power generation amount by a power generation device that generates power from natural energy, to a method for correcting power generation amount prediction, and to a natural energy power generation system.

BACKGROUND

In recent years, techniques have become known for using a power management device (for example, a Home Energy Management System (HEMS)) provided in each consumer household to control the load established in each consumer household, the distributed power source established in each consumer household, and the like (see Patent Literature 1).

As the distributed power source, a power generation device that generates power from natural energy, such as a photovoltaic power generation device or the like, is assumed. The power generation amount during power generation from natural energy can vary for a variety of reasons, yet for control of other devices by the power management device, it may be necessary to predict the power generation amount.

Therefore, it has been proposed to calculate a predicted value of the power generation amount by predicting the solar radiation intensity based on past solar radiation intensity, weather information, and the like and converting the predicted solar radiation intensity into a power generation amount by photovoltaic power generation (see Patent Literature 2).

CITATION LIST

Patent Literature 1: JP 2003-309928 A
Patent Literature 2: JP 2005-086953 A

SUMMARY

An extremely large number of parameters other than solar radiation intensity also affect the power generation amount by photovoltaic power generation. Examples include the type and rated capacity of the photovoltaic cell, the number of cells in series and in parallel, orientation of installation, inclination angle, panel temperature, wiring loss, conversion efficiency of the power conversion device, dirt on the panel surface, and a tendency to be in the shade. These parameters differ for each photovoltaic power generation device installed in an individual consumer household.

Therefore, in order to convert solar radiation intensity into a power generation amount, a large number of parameters needs to be detected accurately, and the optimal conversion formula needs to be sought in advance. In general, however, it is complicated to detect these parameters accurately, and therefore it has been difficult to predict, with a high degree of accuracy, the power generation amount of the photovoltaic power generation device installed in an individual consumer household.

Patent Literature 2 discloses the calculation of a general predicted value of the power generation amount yet does not disclose accurate detection of these parameters. Therefore, even if the solar radiation intensity can be predicted to a high degree of accuracy, it is difficult to make a highly accurate prediction of the power generation amount.

In addition to photovoltaic power generation, other power generation devices that use natural energy such as wind power generation are also affected by many parameters in the same way as photovoltaic power generation. Therefore, it is also difficult to detect parameters accurately in such power generation devices using natural energy, making it difficult to predict the power generation amount to a high degree of accuracy.

The present invention has been conceived in light of the above circumstances and provides a power generation amount prediction apparatus that predicts the power generation amount by a power generation device easily and more accurately, a method for correcting power generation amount prediction, and a natural energy power generation system.

In order to solve the above-described problems, a power generation amount prediction apparatus according to the present invention includes a detector configured to detect a measured value of a power generation amount by a first power generation device that generates power from natural energy; an acquisition unit configured to acquire a predicted value of the power generation amount by the first power generation device at specific times; a storage unit configured to store, for each of the specific times, the measured value and the predicted value for a plurality of days; and a controller configured to calculate a corrected predicted value for each of the specific times based on a maximum measured value, a maximum predicted value, and a predicted value newly acquired by the acquisition unit, the maximum measured value and the maximum predicted value respectively being a maximum value, for each of the specific times, of the measured value and of the predicted value, for a predetermined number of days, stored in the storage unit.

The controller preferably calculates the corrected predicted value by multiplying the predicted value newly acquired by the acquisition unit by the maximum measured value and by the inverse of the maximum predicted value.

Each time the acquisition unit newly receives a predicted value, the storage unit preferably updates the predicted value being stored.

The acquisition unit is preferably a reception unit configured to receive the predicted value over a public telecommunication network.

The acquisition unit preferably acquires weather information over a public telecommunication network, and the controller preferably calculates the predicted value based on the weather information.

The first power generation device is preferably a photovoltaic power generation device, the acquisition unit preferably receives a predicted transition of a weather forecast or an amount of sunshine as the weather information, and the controller preferably calculates the predicted value based on the predicted transition.

The first power generation device is preferably a wind power generation device, the acquisition unit preferably receives a predicted transition of wind speed as the weather information, and the controller preferably calculates the predicted value based on the predicted transition.

Based on the corrected predicted value, the controller preferably creates an operation plan for a second power generation device or a storage cell connected outside the power generation amount prediction apparatus.

A method for correcting power generation amount prediction according to the present invention includes the steps of: (a) accumulating, for each of specific times for a plurality of days, a measured value of a power generation amount by a first power generation device that generates power from natural energy and a predicted value of the power generation amount by the first power generation device at each of the specific times; (b) retrieving a maximum value, for each of the specific times, of the measured value and of the predicted value for a predetermined number of days respectively as a maximum measured value and a maximum predicted value; (c) newly acquiring a predicted value of the power generation amount by the first power generation device; and (d) calculating a corrected predicted value for each of the specific times based on the maximum measured value, the maximum predicted value, and the predicted value newly received in step (c).

A natural energy power generation system according to the present invention includes a power generation amount prediction apparatus and a first power generation device that generates power from natural energy, the power generation amount prediction apparatus including a detector configured to detect a measured value of a power generation amount by the first power generation device; an acquisition unit configured to acquire a predicted value of the power generation amount by the first power generation device at specific times; a storage unit configured to store the measured value and the predicted value for each of the specific times for a plurality of days; and a controller configured to calculate a corrected predicted value for each of the specific times based on a maximum measured value, a maximum predicted value, and a predicted value newly acquired by the acquisition unit, the maximum measured value and the maximum predicted value respectively being a maximum value, for each of the specific times, of the measured value and of the predicted value for a predetermined number of days.

The natural energy power generation system preferably further includes a second power generation device or a storage cell, and based on the corrected predicted value, the controller preferably creates an operation plan for at least one of the second power generation device and the storage cell.

The power generation amount prediction apparatus, method for correcting power generation amount prediction, and natural energy power generation system with the above structure according to the present invention can easily, and to a high degree of accuracy, predict the power generation amount by a power generating device that generates power from natural energy.

BRIEF DESCRIPTION OF DRAWINGS

The present invention will be further described below with reference to the accompanying drawings, wherein.

DESCRIPTION OF EMBODIMENTS

With reference to the drawings, the following describes an embodiment of the present invention.

Figure 1:
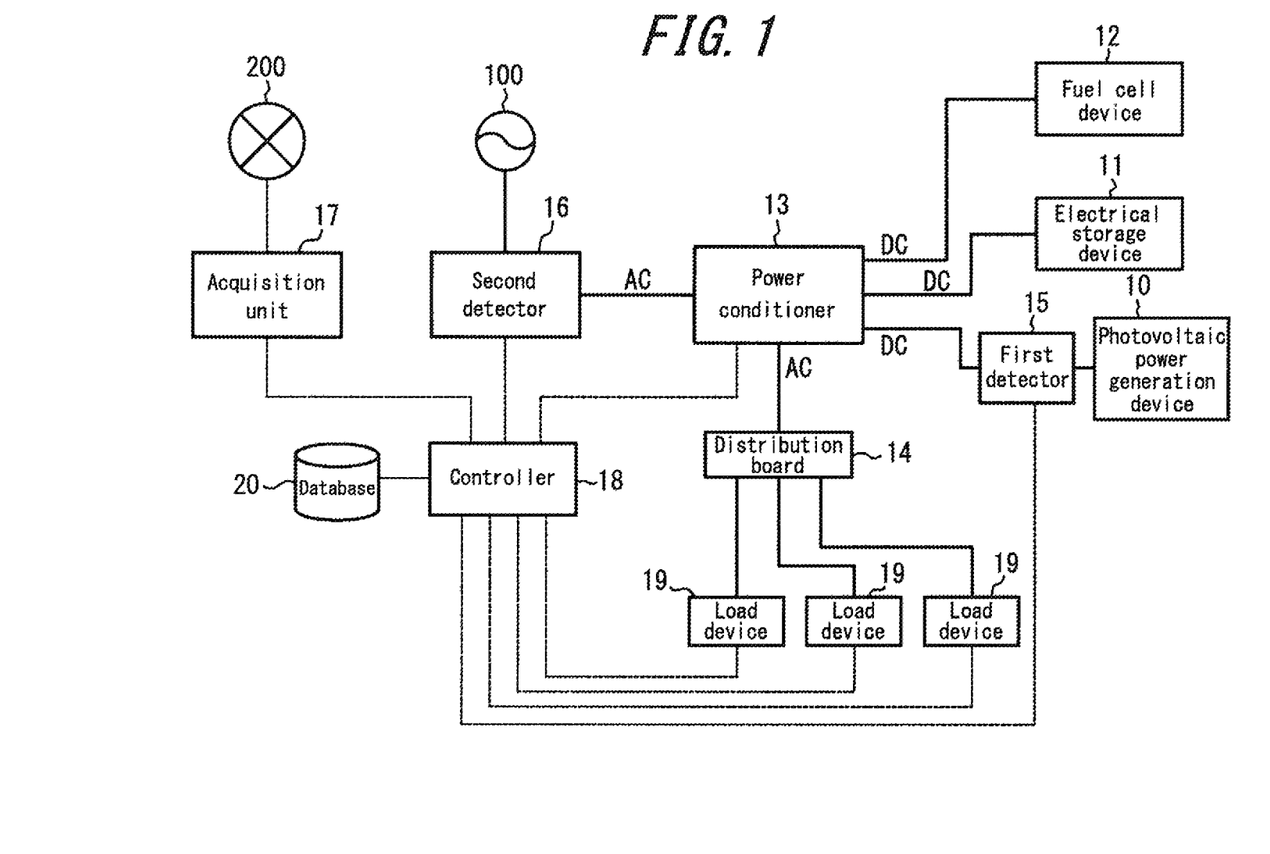
FIG. 1 schematically illustrates the structure of a power control system that includes a power generation amount prediction apparatus according to an embodiment of the present invention.

FIG. 1 is a functional block diagram schematically illustrating the structure of a power control system that includes a power generation amount prediction apparatus according to the present embodiment. As illustrated in FIG. 1, the power control system according to the present embodiment includes a photovoltaic power generation device 10, an electrical storage device 11, a fuel cell device 12, a power conditioner 13, a distribution board 14, a first detector 15, a second detector 16, an acquisition unit 17, and a controller 18.

In FIG. 1, the solid lines connecting functional blocks indicate the flow of power. Furthermore, the dashed lines connecting functional blocks in FIG. 1 indicate the flow of control signals or of communicated information. These dashed lines may be wired lines or wireless.

In the power control system illustrated in FIG. 1, a load device 19 may be supplied with power generated by the photovoltaic power generation device 10 and power discharged by the electrical storage device 11 in addition to power supplied from a commercial power supply 100.

In FIG. 1, the load devices 19 connected to the power control system are a variety of electrical appliances or the like, such as a television, air conditioner, refrigerator, or the like. The power conditioner 13 is connected to these load devices 19 via the distribution board 14 and supplies power to the load devices 19.

The photovoltaic power generation device 10 generates power using sunlight. Therefore, the photovoltaic power generation device 10 is provided with a solar cell panel and converts solar energy to direct current power. In the present embodiment, the photovoltaic power generation device 10 is assumed to generate power using sunlight with solar cell panels installed, for example, on the roof of a house. In the present invention, however, any type of photovoltaic power generation device 10 that can convert solar energy to power may be used.

The electrical storage device 11 is provided with a storage cell and can supply power by discharging the power charged in the storage cell. The electrical storage device 11 can also store power supplied by the commercial power supply 100, photovoltaic power generation device 10, fuel cell device 12, or the like.

The fuel cell device 12 is provided with a fuel cell and generates direct current power by using hydrogen for a chemical reaction with oxygen in the air. One type of fuel cell is a Solid Oxide Fuel Cell (SOFC), yet other methods also generate power by a chemical reaction between hydrogen and oxygen in the air, such as a Polymer Electrolyte Fuel Cell (PEFC), Molten Carbonate Fuel Cell (MCFC), and the like. The hydrogen used for power generation may be directly stored and supplied to the fuel cell, or may be stored as a hydrocarbon gas, with hydrogen being generated by reforming and then supplied to the fuel cell.

The power generation amount of the fuel cell device 12 varies in accordance with the amount of hydrogen and air supplied to the fuel cell. Based on control by the controller 18, the fuel cell device 12 adjusts the power generation amount by adjusting the amount of hydrogen and air supplied to the fuel cell.

The power conditioner 13 converts direct current power supplied from the photovoltaic power generation device 10, electrical storage device 11, and fuel cell device 12 into alternating current power. The power conditioner 13 also converts alternating current power supplied from the commercial power supply 100 into direct current power for charging the electrical storage device 11.

The power conditioner 13 can supply the converted alternating current power and the alternating current power supplied from the commercial power supply 100 to the distribution board 14. The power conditioner 13 can also supply the electrical storage device 11 with the direct current power generated by the photovoltaic power generation device 10 and the fuel cell device 12, as well as with the power supplied from the commercial power supply 100 and converted into direct current power. Additionally, the power conditioner 13 can sell converted alternating current power to the power company via the second detector 16. The power conditioner 13 supplies power based on control by the controller 18.

The distribution board 14 distributes supplied power to each load device 19.

The first detector 15 is connected to the photovoltaic power generation device 10. The first detector 15 detects a measured value of the amount of power that the photovoltaic power generation device 10 generates, i.e. the power generation amount. The first detector 15 notifies the controller 18 of the detected measured value of the power generation amount. For communication between the first detector 15 and the controller 18, for example a short distance communication method such as ZigBee (registered trademark) or the like may be used. The first detector 15 may be internal to the power conditioner 13.

The second detector 16 is, for example, a smart meter. The second detector 16 is connected to the commercial power supply 100 and detects the power supplied by the commercial power supply 100. The second detector 16 is also connected to the power conditioner 13 and detects the power generated by the photovoltaic power generation device 10 and sold to the power company. The second detector 16 may be internal to the power conditioner 13.

The second detector 16 notifies the controller 18 of the detected power supplied by the commercial power supply 100 and the power sold to the power company. Also for communication between the second detector 16 and the controller 18, for example a short distance communication method such as ZigBee or the like may be used.

The acquisition unit 17 is a receiver connected to a network 200 and receives a variety of information including a predicted value of the power generation amount by photovoltaic power generation. The acquisition unit 17 is connected to the controller 18 and notifies the controller 18 of information acquired by reception.

The controller 18 may, for example, be configured using an Energy Management System (EMS) or the like, of which an HEMS is representative, and acquires information from the power conditioner 13, first detector 15, second detector 16, acquisition unit 17, and load device 19. Based on the acquired information, the controller 18 controls and manages the devices configuring the power control system.

For example, the controller 18 controls power consumption by the load devices 19 by being connected to the load devices 19 via a wired or wireless connection. A variety of methods may be used to connect the controller 18 and the load device 19 wirelessly, such as infrared communication, Power Line Communication (PLC), ZigBee, or the like.

The controller 18 also monitors the power supplied from the power conditioner 13 to the load device 19 via the distribution board 14 by being connected to the power conditioner 13 via a wired or wireless connection.

The controller 18 also monitors the power that charges the electrical storage device 11 via the power conditioner 13. Furthermore, via the second detector 16, the controller 18 for example may receive information on Demand Response (DR) from the power company or the like.

As described above, the controller 18 also controls the supply to the load device 19 of the power generated by the photovoltaic power generation device 10, the power discharged by the electrical storage device 11, the power generated by the fuel cell device 12, and the power from the commercial power supply 100, controls the supply of power from the photovoltaic power generation device 10, fuel cell device 12, and commercial power supply 100 to the electrical storage device 11, and controls the sale of power generated by the photovoltaic power generation device 10 and the fuel cell device 12 to the power company.

Furthermore, together with the first detector 15, the acquisition unit 17, and a database 20, the controller 18 functions as a power generation amount prediction apparatus, calculating a corrected predicted value for the power generated by the photovoltaic power generation device 10. Details on the calculation of the corrected predicted value are provided below. Based on the corrected predicted value, the controller 18 also creates an operation plan that includes charging and discharging the electrical storage device 11, adjusting the power generation amount of the fuel cell device 12, and selling power to the power company.

In order to accumulate various collected information, the controller 18 is provided with the database 20 (storage unit). The database 20 can be configured using any memory device or the like.

Details on the calculation by the controller 18 of the corrected predicted value are provided below. As described above, the controller 18 acquires the predicted value of the power generation amount by photovoltaic power generation via the acquisition unit 17 over the network 200. The controller 18 stores the acquired predicted value in the database 20.

The database 20 can store the predicted values of the power generation amount for a plurality of days, for example the predicted values for 30 days. Before acquiring the predicted value for the next day, the database 20 stores the predicted values from 29 days ago through the current day. Upon the acquisition unit 17 newly acquiring the predicted value for the next day, the database 20 updates the predicted values after the below-described calculation of the corrected predicted value. Storage is not limited, however, to 30 days of predicted values.

Note that the company providing the predicted value of the power generation amount provides the predicted value of the power generation amount by photovoltaic power generation. This company for example calculates the next day's predicted value of the power generation amount by photovoltaic power generation every day. By the calculated predicted value being recorded on a server, the predicted value is transmitted to the acquisition unit 17 in an individual consumer household via the network 200.

The predicted value of the power generation amount by photovoltaic power generation provided by the company is a general predicted value that is based on the solar radiation intensity for each region in which the photovoltaic power generation device 10 is installed. The power generation amount by photovoltaic power generation depends greatly on the solar radiation intensity and therefore varies over time during the day. Accordingly, the general predicted value is calculated at specific times, for example at 30 minute intervals from 0:00 to 23:30. The above-described database 20 stores the predicted value separately for each of the specific times for 30 days. Note that the specific times at which the general predicted value is calculated are not limited to the above times and may be different times.

The general predicted value is provided as the solar radiation intensity prediction or, for example, as the predicted power generation amount per 1 kW rating. In this case, the parameters other than solar radiation intensity that affect the power generation amount by photovoltaic power generation are calculated as an average representative value.

As described above, the controller 18 acquires the measured value of the generated power by the photovoltaic power generation device 10 from the first detector 15. The controller 18 stores the measured value of the generated power for each of the same specific times as the predicted value, for the same number of days as the predicted value, in the database 20.

Each measured value of the generated power stored in the database 20 is the average value of the generated power for a certain length of time, using the specific time as a reference. For example, the measured value of the generated power at 0:00 is the average value of the generated power for 30 minutes from 23:45 to 0:15.

For example every 30 seconds, the first detector 15 detects the generated power at that instant and notifies the controller 18. The controller 18 calculates the average value of the power generation amount for which notification is received from the first detector 15 over 30 minutes. The controller 18 stores the calculated average value in the database 20 as the measured value of the generated power for the corresponding time.

Upon the acquisition unit 17 acquiring a new predicted value when the predicted values and measured values for 30 days are being stored in the database 20, the controller 18 retrieves the maximum value of the predicted values and of the measured values for 30 days stored in the database 20. Note that the maximum value is retrieved separately for each of the specific times. Accordingly, the maximum value of the predicted value and of the measured value is retrieved for each of the times 0:00, 0:30, 1:00, , . . . , and 23:30.

Upon retrieving the maximum values, the controller 18 uses the maximum value of the predicted value and of the measured value respectively as the maximum predicted value and the maximum measured value and calculates the corrected predicted value based on the predicted value newly acquired by the acquisition unit 17. As described above, the predicted value acquired over the network 200 is the predicted value for each of the specific times, and the controller 18 calculates the corrected predicted value for each of the specific times.

The controller 18 calculates the corrected predicted value using the maximum predicted value, the maximum measured value, and the newly acquired predicted value for the same specific time. The controller 18 calculates the corrected predicted value by multiplying the newly acquired predicted value by the maximum measured value and the inverse of the maximum predicted value, i.e. using the formula $(A \times B)/C$, where A is the newly acquired predicted value, B is the maximum measured value, and C is the maximum predicted value. For example, the controller 18 calculates the corrected predicted value for 0:00 by multiplying the newly acquired predicted value for 0:00 by the maximum measured value for 0:00 and by the inverse of the maximum predicted value for 0:00. The corrected predicted value for the other specific times is also calculated similarly.

Figure 2:
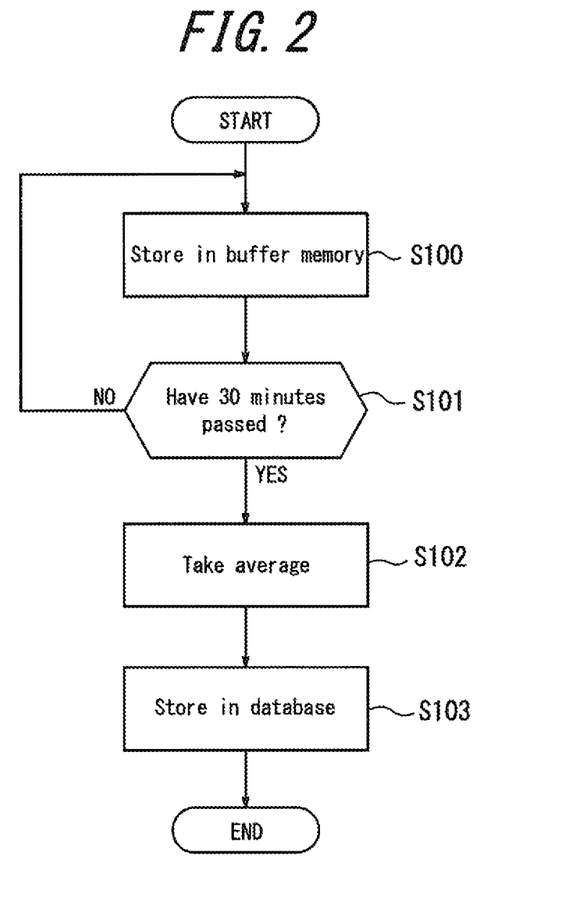
FIG. 2 is a flowchart illustrating measured value accumulation processing executed by the controller.

Next, the measured value accumulation processing executed by the controller 18 is described using the flowchart in FIG. 2. When the controller 18 acquires the measured value to be detected initially by the first detector 15 for a specific time, for example the measured value for 23:45 in the case of the specific time being 0:00, then the controller 18 starts the measured value accumulation processing.

In step S100, the measured value acquired by the controller 18 is stored in a buffer memory provided in the controller 18. Next, in step S101, the controller 18 determines whether 30 minutes have passed from the start of the measured value accumulation processing. When 30 minutes have not passed, processing returns to step S100. Subsequently, steps S100 and S101 are repeated until 30 minutes pass. When 30 minutes have passed, processing proceeds to step S102.

In step S102, the controller 18 calculates the average value of the measured values stored in the buffer memory. Next, in step S103, the controller 18 stores the average value calculated in step S102 at a corresponding address in the database 20 as the measured value for the corresponding specific time. After storing the measured value, the controller 18 deletes the measured values stored in the buffer memory and terminates the measured value accumulation processing.

Figure 3:
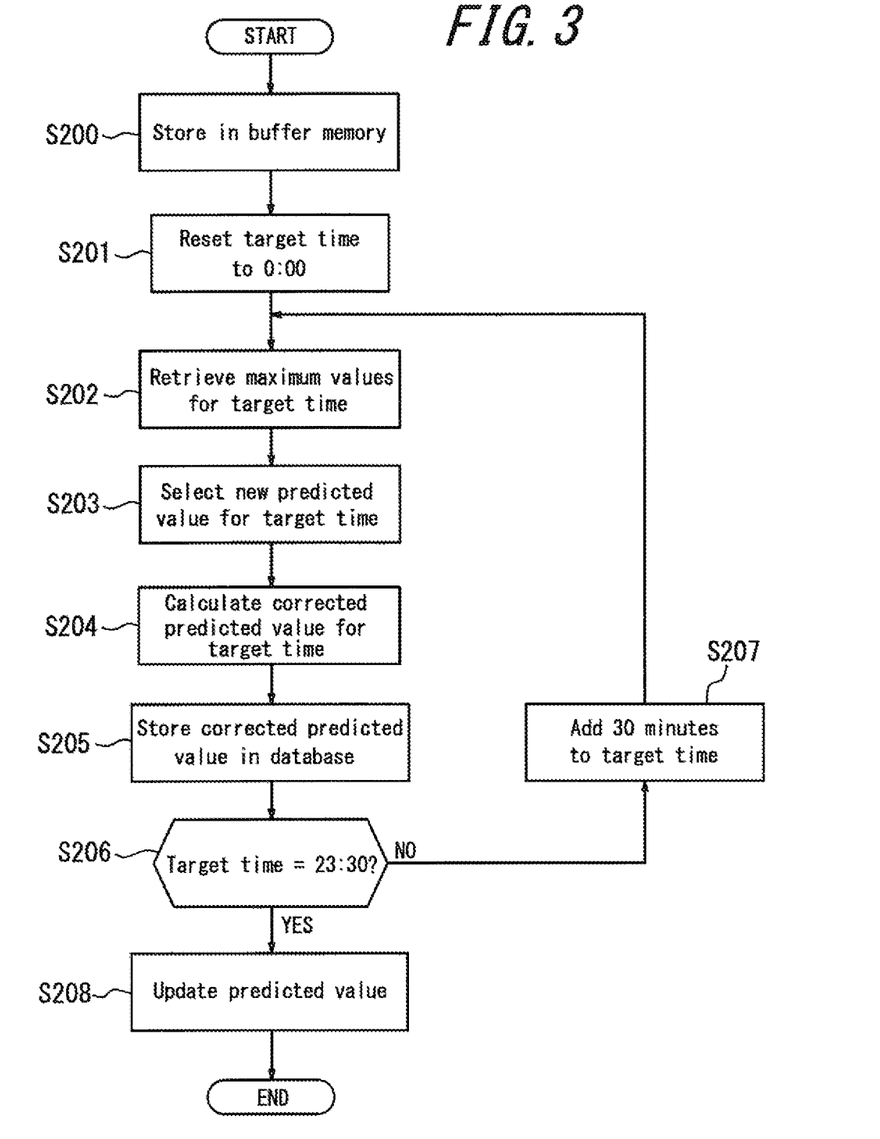
FIG. 3 is a flowchart illustrating predicted value accumulation processing executed by the controller.

Next, the predicted value accumulation processing, including corrected predicted value calculation, executed by the controller 18 is described using the flowchart in FIG. 3. When the controller 18 acquires the predicted value acquired by the acquisition unit 17 over the network 200, the controller 18 starts the predicted value accumulation processing.

In step S200, the controller 18 stores the newly acquired predicted value separately for each specific time in the buffer memory. Next, in step S201, the controller 18 resets a target time, which is set to one of the specific times from 0:00 to 23:30, to 0:00. After the target time is reset, processing proceeds to step S202.

In step S202, the controller 18 retrieves the maximum value of the predicted value and of the measured value for the target time for 30 days stored in the database 20. The controller 18 selects the retrieved maximum values as the maximum predicted value and the maximum measured value. After selection, processing proceeds to step S203.

In step S203, the controller 18 selects the predicted value for the target time from among the new predicted values stored in the buffer memory in step S200. After selection of the predicted value for the target time, processing proceeds to step S204.

In step S204, the controller 18 calculates the corrected predicted value for the target time based on the maximum predicted value and maximum measured value selected in step S202 and the predicted value for the target time selected in step S203. Next, in step S205, the controller 18 stores the corrected predicted value calculated in step S204 at a corresponding address in the database 20. After storage in the database 20, processing proceeds to step S206.

In step S206, the controller 18 determines whether the target time is set to 23:30. When the target time is not set to 23:30, processing proceeds to step S207. Conversely, when the target time is set to 23:30, processing proceeds to step S208.

In step S207, the controller 18 sets a new target time by adding 30 minutes to the target time. After the new setting, processing returns to step S202. Subsequently, steps S202 through S207 are repeated until the target time reaches 23:30.

In step S208, the controller 18 uses the predicted values stored in the buffer memory in step S200 to update the predicted value stored in the database 20. After updating, the controller 18 terminates the predicted value accumulation processing.

Figure 4:
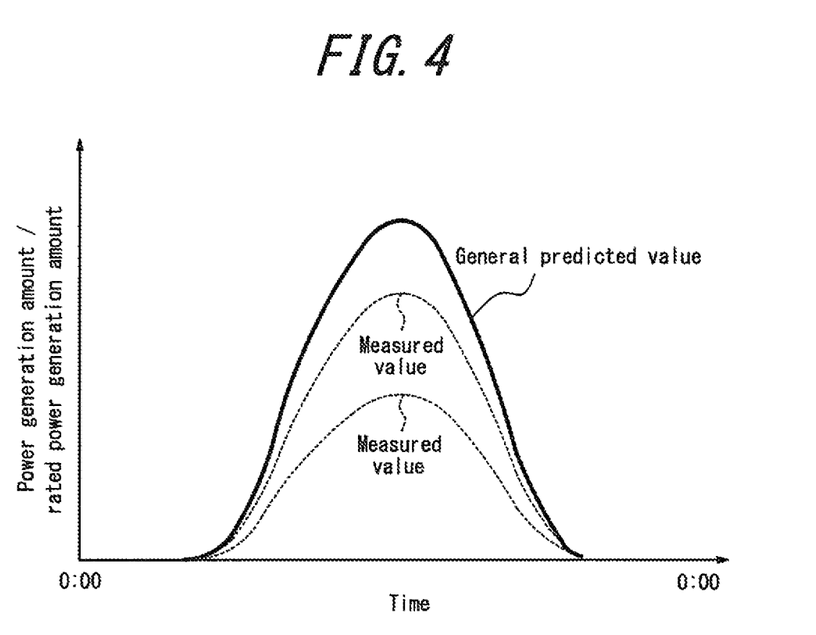
FIG. 4 is a first graph illustrating the ratio of the power generation amount to the rated power generation amount at each time.

According to the power generation amount prediction apparatus of the present embodiment with the above structure, it is possible to calculate corrected predicted values appropriate for individual photovoltaic power generation devices 10 from general predicted values. This effect is described with reference to FIG. 4. FIG. 4 is a first graph illustrating the power generation amount under ideal conditions, such as sunshine all day long.

Even if the solar radiation intensity of sunlight in a region is uniform, the power generation amount of each photovoltaic power generation device 10 installed in the region generally differs. For example, even when generating power using sunlight of the same solar radiation intensity, the measured value of the power generation amount differs for individual photovoltaic power generation devices 10 due to differences such as dirt on the panel surface, inclination angle, and the like (dashed lines; two examples in FIG. 4). The measured values thus differ from the general predicted values (solid line).

In order to convert the general predicted value into a corrected predicted value for the individual photovoltaic power generation devices 10, the general predicted value is multiplied by a ratio of a past measured value to a past general predicted value. However, in order to improve the conversion accuracy of the corrected predicted value, it is necessary for the solar radiation intensity to be substantially equal corresponding to the general predicted value and the measured value that are used to calculate the ratio.

Therefore, in the present embodiment, by using the maximum predicted value and the maximum measured value, it is possible to use a predicted value and a measured value converted from a substantially equal solar radiation intensity. As in the present embodiment, it is assumed that there will be a sunny day among a 30-day period, for example, and when it is sunny, the predicted value and the measured value are typically the maximum value of the general predicted value and of the generated power amount by an individual photovoltaic power generation device 10. Accordingly, by using the maximum predicted value and the maximum measured value, the conversion accuracy of the corrected predicted value can be improved, as can the prediction accuracy of the corrected predicted value.

Figure 5:
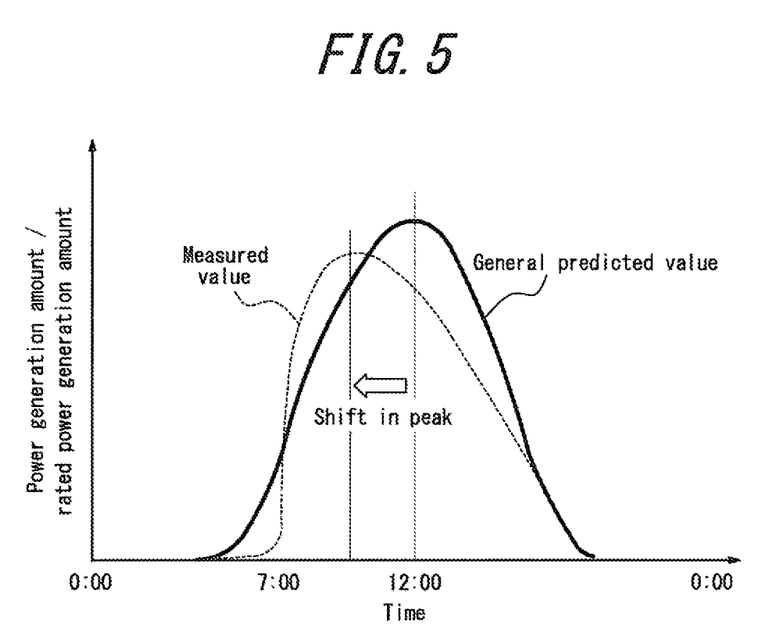
FIG. 5 is a second graph illustrating the ratio of the power generation amount to the rated power generation amount at each time.

Furthermore, according to the power generation amount prediction apparatus of the present embodiment, it is possible to eliminate a variable factor due to the time of the power generated amount by individual photovoltaic power generation devices 10. This effect is described with reference to FIG. 5. FIG. 5 is a second graph illustrating the power generation amount for each time during sunny weather.

As described above, the general predicted value provided by the company is a predicted value in accordance with solar radiation intensity. As illustrated in FIG. 5, it is assumed that the predicted value of the power generation amount (solid line) reaches the maximum at 12:00.

On the other hand, the parameters that affect the power generation amount by photovoltaic power generation include the orientation of installation, a shadow cast by a neighboring building, and the like, which cause the power generation amount to vary by time. For example, if a building or the like is located on the east side of a solar panel and the sun does not strike the solar panel in the early morning, the power generation amount is less than the general predicted value (near 7:00 in the graph). Furthermore, if the solar panel is installed facing east, the peak of the power generation amount is earlier than 12:00.

Therefore, in the present embodiment, the same ratio of the maximum measured value to the maximum predicted value is calculated for each of the specific times and multiplied by the predicted value for each time in order to calculate the corrected predicted value. By calculating the corrected predicted value with this method, the variable factor due to time can be eliminated.

According to the power generation amount prediction apparatus of the present embodiment, the corrected predicted value is calculated using a predicted value and measured value from the past. Hence, it is not necessary to detect parameters that affect the power generation amount by photovoltaic power generation.

Furthermore, according to the power generation amount prediction apparatus of the present embodiment, the effect of seasonal variable factors among the parameters affecting the power generation amount by photovoltaic power generation can be eliminated.

For example, the panel temperature and height of the sun differ between summer and winter. These factors affect the power generation amount by photovoltaic power generation. Therefore, if the maximum predicted value and maximum measured value are not changed in accordance with the season, the prediction accuracy of the corrected predicted value drops.

By contrast, in the power generation amount prediction apparatus of the present embodiment, the maximum values among the predicted values and measured values for a predetermined period of time are used as the current standard. Hence, a maximum predicted value and a maximum measured value in accordance with the season can be used for calculation of the corrected predicted value. Accordingly, the effect of seasonal variable factors can be eliminated.

The present invention has been described based on the drawings and an embodiment, yet it should be noted that a person of ordinary skill in the art could easily make a variety of modifications and adjustments based on the present disclosure. Accordingly, these modifications and adjustments should be understood as being included within the scope of the present invention.

For example, in the present embodiment, the power generation amount prediction apparatus calculates the corrected predicted value for the power generation amount of the photovoltaic power generation device 10, yet the power generation device for which the corrected predicted value is calculated is not limited to the photovoltaic power generation device 10. For example, the corrected predicted value may be calculated for the power generation amount corresponding to a wind speed predicted value or the like in a power generation device that generates power from natural energy such as a wind power generation device or the like.

Furthermore, in the present embodiment, the acquisition unit 17 receives the predicted value of the power generation amount by photovoltaic power generation, yet the acquisition unit 17 may receive weather information that is a predicted transition of a weather forecast, an amount of sunshine, wind speed, or the like, and the acquisition unit 17 may refer to a correspondence table stored internally in advance for conversion, or use a predetermined calculation formula for calculation, based on the received weather information in order to acquire the general predicted value of the power generation amount by photovoltaic power generation, wind power generation, or the like.

REFERENCE SIGNS LIST

10: Photovoltaic power generation device
11: Electrical storage device
12: Fuel cell device
13: Power conditioner
14: Distribution board
15: First detector
16: Second detector
17: Acquisition unit
18: Controller (power generation amount prediction apparatus)
19: Load device
20: Database (storage unit)
100: Commercial power supply
200: Network

The invention claimed is:

1. A power generation amount prediction apparatus comprising:
a sensor configured to detect a measured value of a power generation amount by a first power generation device that generates power from natural energy;
a memory configured to store, for each of specific times, measured value and a predicted value of the power generation amount by the first power generation device for a plurality of days; and
a controller configured to
calculate a corrected predicted value for each of the specific times based on a maximum measured value, a maximum predicted value, and a predicted value newly acquired, the maximum measured value and the maximum predicted value respectively being a maximum value, for each of the specific times, of the measured value and of the predicted value, for a predetermined number of days, stored in the memory, wherein the controller calculates the corrected predicted value by multiplying the predicted value newly acquired by the maximum measured value and by the inverse of the maximum predicted value,
based on the corrected predicted value, create an operation plan for a second power generation device or a storage cell connected outside the power generation amount prediction apparatus, and
control a distribution of power within a power system based on the corrected predicted value.

2. The power generation amount prediction apparatus according to claim 1, wherein each time a predicted value is newly acquired, the memory updates the predicted value being stored.

3. The power generation amount prediction apparatus according to claim 1, wherein the predicted value is acquired over a public telecommunication network.

4. The power generation amount prediction apparatus according to claim 1, wherein the controller calculates the predicted value based on weather information acquired over a public telecommunication network.

5. The power generation amount prediction apparatus according to claim 4, wherein the first power generation device is a photovoltaic power generation device, the weather information comprises a predicted transition of a weather forecast or an amount of sunshine, and the controller calculates the predicted value based on the predicted transition.

6. The power generation amount prediction apparatus according to claim 4, wherein the first power generation device is a wind power generation device, the weather information comprises a predicted transition of wind speed, and the controller calculates the predicted value based on the predicted transition.

7. A method for correcting power generation amount prediction, comprising:
accumulating, for each of specific times for a plurality of days, a measured value of a power generation amount by a first power generation device that generates power from natural energy and a predicted value of the power generation amount by the first power generation device at each of the specific times;
retrieving a maximum value, for each of the specific times, of the measured value and of the predicted value of the power generation amount by the first power generation device for a predetermined number of days respectively as a maximum measured value and a maximum predicted value;
newly acquiring a predicted value of the power generation amount by the first power generation device;
calculating a corrected predicted value for each of the specific times, based on the maximum measured value, the maximum predicted value, and the predicted value newly acquired, by multiplying the predicted value newly acquired by the maximum measured value and by the inverse of the maximum predicted value;
based on the corrected predicted value, creating an operation plan for an external second power generation device or an external storage cell; and
controlling a distribution of power within a power system based on the corrected predicted value.

8. A natural energy power generation system comprising a power generation amount prediction apparatus and a first power generation device that generates power from natural energy, the power generation amount prediction apparatus comprising:
a sensor configured to detect a measured value of a power generation amount by the first power generation device;
a memory configured to store, for each of specific times, the measured value and a predicted value of the power generation amount by the first power generation device for a plurality of days; and
a controller configured to
calculate a corrected predicted value for each of the specific times based on a maximum measured value, a maximum predicted value, and a predicted value newly acquired, the maximum measured value and the maximum predicted value respectively being a maximum value, for each of the specific times, of the measured value and of the predicted value, for a predetermined number of days, stored in the memory, wherein the controller calculates the corrected predicted value by multiplying the predicted value newly acquired by the maximum measured value and by the inverse of the maximum predicted value, based on the corrected predicted value, create an operation plan for a second power generation device or a storage cell connected outside the power generation amount prediction apparatus, and control a distribution of power within a power system based on the corrected predicted value.

9. The natural energy power generation system according to claim 8, further comprising: the second power generation device or the storage cell.

* * * * *